United States Patent [19]

Göransson et al.

[11] Patent Number: 4,933,561
[45] Date of Patent: Jun. 12, 1990

[54] MONOLITHIC OPTOCOUPLER WITH ELECTRICALLY CONDUCTING LAYER FOR DIVERTING INTERFERENCE

[75] Inventors: Sture Göransson, Bissingen/Teck, Fed. Rep. of Germany; Tomas Hidman, Västerås, Sweden

[73] Assignee: Asea Brown Boveri AB, Vasteras, Sweden

[21] Appl. No.: 278,895

[22] Filed: Dec. 2, 1988

[30] Foreign Application Priority Data

Dec. 2, 1987 [SE] Sweden .................................. 8704822

[51] Int. Cl.⁵ .......................................... G02B 27/00
[52] U.S. Cl. ........................................ 250/551; 357/19
[58] Field of Search .................... 357/19, 84; 250/551; 455/602

[56] References Cited

U.S. PATENT DOCUMENTS

| | | | |
|---|---|---|---|
| 3,436,548 | 4/1969 | Biard | 357/19 |
| 3,639,770 | 2/1972 | Zizelmann | 250/551 |
| 3,748,480 | 7/1973 | Coleman | 250/211 T |
| 3,818,451 | 6/1974 | Coleman | 250/551 |
| 3,881,113 | 4/1975 | Rideout | 250/551 |
| 4,021,834 | 5/1977 | Epstein | 250/551 |
| 4,112,308 | 9/1978 | Olschewski | 357/19 |
| 4,647,148 | 3/1987 | Katagiri | 357/84 |

*Primary Examiner*—David C. Nelms
*Assistant Examiner*—Sherrie Hsia
*Attorney, Agent, or Firm*—Pollock, Vande Sande & Priddy

[57] ABSTRACT

A monolithic optocoupler has a semi-insulating substrate and two opto-components (A, B) arranged thereon, between which signals and/or power can be transmitted through optical radiation. In order to suppress interference transferred capacitively and/or resistively between the two components, screening means are arranged on the substrate between the two components. The screening member is produced using the same type of integrated-circuit technique as for the opto-components, and preferably in the same manufacturing step as these components. The screening member is suitably provided with connection means for its grounding.

16 Claims, 3 Drawing Sheets

MONOLITHIC OPTOCOUPLER WITH ELECTRICALLY CONDUCTING LAYER FOR DIVERTING INTERFERENCE

TECHNICAL FIELD

The present invention relates to a monolithic optocoupler having an insulating substrate (1) and two opto-components produced in integrated form on the substrate and spaced apart from each other, at least one of the components being arranged to emit optical radiation towards the other, and at least one of the components being arranged to receive radiation emitted by the other.

BACKGROUND ART

An optocoupler comprises an optical signal transmitter, for example a light-emitting diode or laser diode, and an optical signal receiver, for example a photodiode or photo-transistor. The signal transmitter is connected to a first electrical circuit and the signal receiver to a second electrical circuit. A signal from the first circuit is converted to an optical signal in the signal transmitter. This optical signal is transmitted in the form of optical radiation to the signal receiver, where it is converted to an electrical signal and then supplied to the second circuit. Galvanic separation between the two electrical circuits is obtained with the aid of an optocoupler.

The optocoupler is generally designed as one component including the signal transmitter and the signal receiver, suitable radiation-transfer means, for example in the form of light guides or mirrors and electrically insulating means to galvanically separate the two circuits.

Both information and power can be transmitted from one circuit to the other with the aid of an optocoupler.

Separate optocouplers may be used for the different signals if the signals are to be transmitted in both directions. Alternatively a single optocoupler may be used for a two-way transmission of signals and/or power, in which case each of the optical components is designed to operate optionally as an emitter or receiver of optical radiation.

An optocoupler is often required to have small dimensions. It is then suitably produced in the form of a monolithic optocoupler, using the integrated-circuit technique. The two electro-optical components are then arranged on a common substrate. The layers which together form the two components are successively produced during manufacturing on the substrate by means of liquid phase epitaxy (LPE), molecular beam epitaxy (MBE) or chemical vapor deposition (CVD), for instance.

The substrate may consist of a good insulator, for example, sapphire. It has also been found to be advantageous to make a substrate—of a "semi-insulating" material, preferable of the same type as the material of which the two components are made, for example gallium arsenide. The resistivity of a semi-insulating material may be within the range $10^7$–$10^{12}$ ohmcm.

Optocouplers of this type are previously known from U.S. Pat. No. 4,212,020 and PCT application publication number WO 85/04491.

An optocoupler is already known through U.S. Pat. No. 4,021,834, in which both optical components are applied on a common substrate. This consists of gallium arsenide and has a strongly n-doped, and thus low-resistive, part extending between the two components. The two components are electrically insulated from each other since they are arranged on $SiO_2$ layers on the surface of the substrate. Since, in practice, these layers can only be made thin, thus their break-through voltage will be low, and this known optocoupler can therefore only be used for extremely low voltages. Therefore, in order to meet realistic demands for electrical insulation between the two components, a different category of optocoupler must be used, namely an optocoupler with an insulating or semi-insulating substrate. The interference problems which the present invention aims at solving occur in such optocouplers. However, these problems are not mentioned in the U.S. patent specification.

The above-mentioned publication also describes how a modulating signal source can be connected to the substrate with the aid of metal contacts applied on both sides of the substrate with the object of using the optocoupler as a phase modulator.

In monolithic optocouplers, the optical radiation can be transmitted in the known manner from the transmitting to the receiving component in various ways. Mirroring or total-reflecting members may be arranged to ensure that as much radiation from the emitter as possible reaches the receiver. Alternatively, a transparent layer acting as a waveguide may be arranged between the two components. According to another alternative, the substrate may be used as a waveguide for the optical radiation, and utilized as such.

It has been found in monolithic optocouplers that interference may be transmitted between the two electrical circuits connected to the optocoupler.

DISCLOSURE OF THE INVENTION

The object of the invention is to achieve a monolithic optocoupler of the type described in the introduction, which offers a considerable reduction in the above-mentioned interference.

An optocoupler according to the present invention offers efficient screening against interference without any extra process steps, or only a minimum of such steps, being required during its manufacturing. Efficient screening of both capacitively and resistively transmitted interference can be obtained.

BRIEF DESCRIPTION OF THE DRAWING

The invention will be described more fully in the following with reference to the accompanying FIGS. 1–6, wherein:

FIG. 2 shows how the screen according to the invention may consist of a metal layer arranged on the surface of the substrate;

FIG. 3 shows how, with the aid of a groove in the substrate, both resistive and capacitive screening can be obtained;

FIGS. 4 and 5 show embodiments in which the screen is constructed of the same type of semiconducting layer as the two optical components;

FIG. 6 shows how, according to another variant of the invention, a screen is obtained with the aid of reverse biased pn-junctions between the opto-components and the substrate.

DESCRIPTION OF THE PREFERRED EMBODIMENTS

Figure 1A:
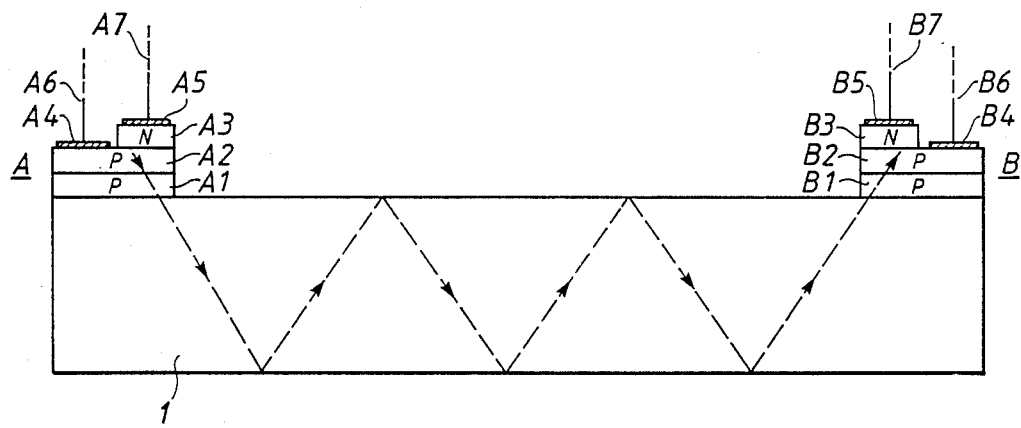
FIG. 1a shows the optocoupler itself and FIG. 1b its connection between two electrical circuits.

FIG. 1a shows an optocoupler of the previously known type. The component comprises a substrate 1 carrying the two opto-components A and B. The substrate may suitably consist of a thin plate of a semi-insulating material such as gallium arsenide. A substrate of this material can have a conductivity within the interval $10^7$–$10^{12}$ ohmcm, e.g. $10^8$ ohmcm. The two opto-components A and B are produced spaced apart from each other on the substrate. This can be achieved in the known manner, such as by liquid phase epitaxy (LPE) or chemical vapor deposition (CVD) of the material in the three layers forming each opto-component. The material may consist of gallium arsenide doped with aluminium, for instance. Component A consists of two p-conducting layers A1 and A2 and an n-conducting layer A3. To ensure good contact the latter two layers are provided with metallizations A4 and A5, to which connection wires A6 and A7 are attached. Component A can be utilized either as a radiation-emitting diode or as radiation detecting photodiode. In the first case, a current is passed in the conducting direction through the diode formed by layers A2 and A3, the optical radiation then being emitted from the region at the pn-junction between these two layers. In the latter case, the diode is biased in a blocking direction and the current flowing in the reverse direction which is generated by the optical radiation is detected by suitable circuits, not shown.

Component B may be identical to component A. Each of the two components can thus operate optionally as an emitter or detector of radiation. Depending on the intended application, therefore, signal transmission may be one-way, in which case one element always functions as the radiation emitter and the other element always functions as the radiation detector, or it may be two-way, in which case the components function alternately as emitter and detector for optical radiation.

The radiation can be transmitted from the transmitting to the receiving component in several ways. One way is shown in FIG. 1a where the substrate 1 is utilized as a waveguide to transmit radiation between the components. Alternatively some form of mirroring member may be arranged above the components, designed in such a manner that as large a part as possible of the radiation emitted from the transmitting element is reflected towards the receiving component. Such a mirroring member may consist, for instance, of an approximately semi-spherical body applied on the substrate and encompassing the two components, the spherical surface of this body reflecting the rays either due to total reflection or by the surface being provided with a reflecting coating.

Other materials can of course be used for the substrate, as well as for the two opto-components. The substrate may consist, for instance, of an insulator such as sapphire.

Figure 1B:
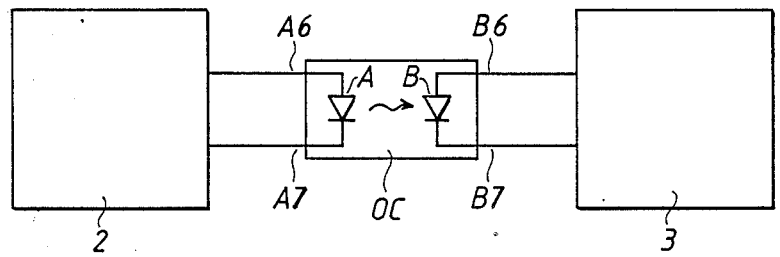
FIG. 1 shows the principle for an known optocoupler.

FIG. 1b shows schematically how the optocoupler according to FIG. 1a is used to connect two electrical circuits 2 and 3. The optocoupler is designated OC in FIG. 1b. As in FIG. 1a, it is assumed that A is the transmitting and B the receiving component. The circuit 2 causes a current to flow through component A in the conducting direction so that the current, and thus the radiation emitted by A, is modulated with the information to be transmitted to circuit 3. This radiation is detected by the component B, which is biased in the reverse direction, and with the aid of known detecting circuits, included in circuit 3.

As mentioned earlier, electrical interference can be transmitted between circuits 2 and 3 via the optocoupler. This may occur either capacitively or resistively. A certain leakage capacitance exists between the two components A and B of the optocoupler, partly through the environment between the two components and partly through the substrate 1. If the substrate is semi-insulating, interference can be transmitted resistively between the components by a current flowing through the substrate. Since the detecting circuits in devices of this type must often be extremely sensitive, this interference may cause serious problems. Since both components A and B are integrated in one and the same unit, and since the dimensions of such a unit may be extremely small, it is difficult or impossible to eliminate the drawbacks caused by the interference by means of conventional screening.

Figure 2:
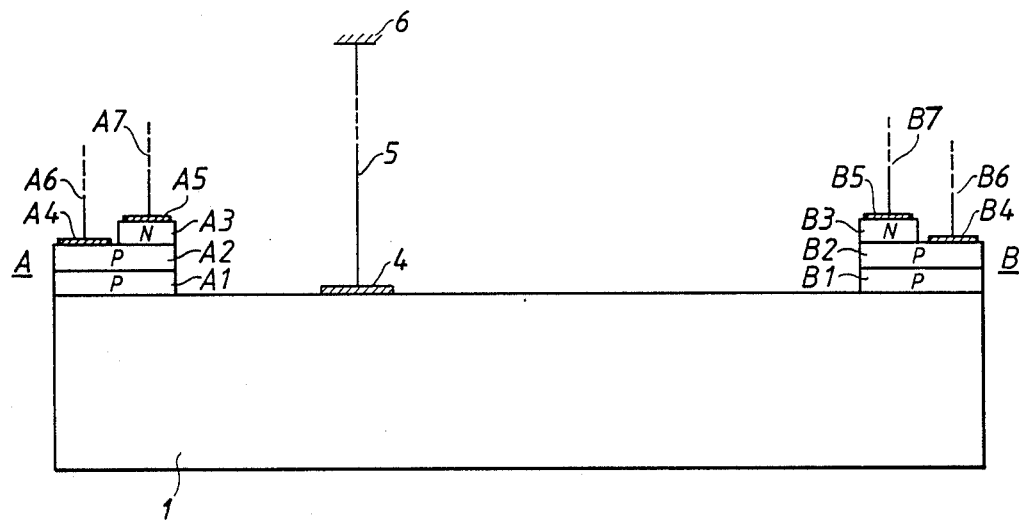
FIGS. 2–6 show embodiments of the optocoupler according to the invention.

FIG. 2 shows an example of an optocoupler according to the invention. It differs from the optocoupler shown in FIG. 1 in that a metal layer 4 is applied on the surface of the substrate 1 and connected via a conductor 5 to an earth connection 6. The metal layer 4 is produced using the same technique as that using to produce the two opto-components, that is the metal layer can be produced in the same manufacturing step as the metal layers A4, A5, B4 and B5. Manufacturing an optocoupler according to the invention thus entails negligible complication as compared with the manufacture of previously known optocouplers.

The metal layer 4 has two functions. It effectively gathers any interference currents flowing between the two components A and B. The layer 4 also serves as a screen which greatly reduces the interference signals transmitted capacitively through the environment and through the substrate between the two components.

Depending on the intended application, one or more screens may be placed between the opto-components. A screen may be placed symmetrically or asymmetrically depending on the interference picture.

Figure 3:
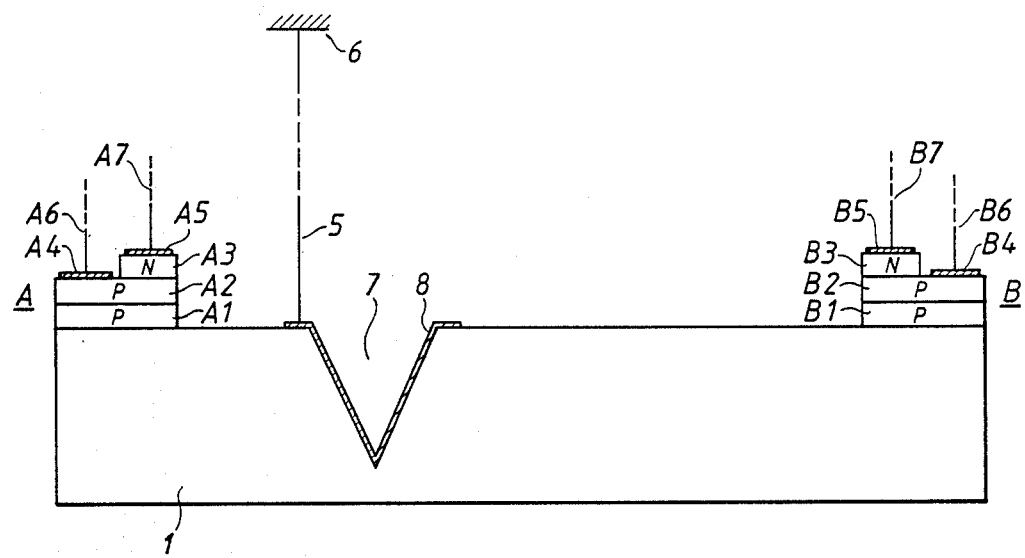

FIG. 3 shows an alternative embodiment of an optocoupler according to the invention. It differs from the optocoupler shown in FIG. 2 in that a groove 7 is effected in the substrate 1, for example by etching, transversely across the substrate between the two opto-components.

The walls of the groove are provided with a screening metal layer 8 which, in the same way as the layer 4 in FIG. 2, is connected to an earthed point 6 via an earthing conductor 5. Since etching and metallization are steps which occur in the normal production of the two components of the optocoupler, this embodiment does not either entail any noticeable complication of the production process, nor is it any more expensive. If the groove 7 is made deep in relation to the thickness of the substrate 1, it will form an effective block against resistive transmission of interference through the substrate. If the substrate is used as a waveguide between the components, however, a deep groove will impede transmission of the radiation. However, this drawback can be reduced or eliminated by making the metallic layer 8 so thin that radiation can pass through it, or by the layer 8 being in the form of a net, grid or the like. Supplementary to or as an alternative to the metal layer 8, the groove 7 may be filled or partially filled with an optically transparent material, such as a highly doped and thus electrically highly conductive material of the same type as the substrate material.

Figure 4:
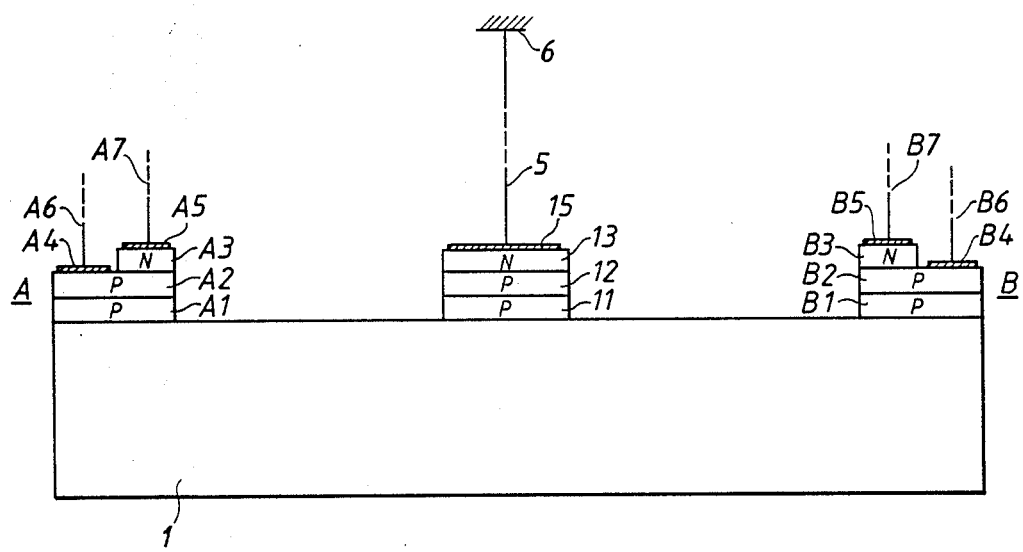

FIG. 4 shows another variant of an optocoupler according to the invention. In this case, the screened member consists of the semiconductor body formed by the three layers 11, 12 and 13 and is applied on the substrate 1 between the two opto-components A and B. During production, layer 11 can suitably be formed simultaneously with layers A1 and B1, layer 12 simultaneously with layers A2 and B2 and layer 13 simultaneously with layers A3 and B3. It might then be advantageous to deposit the layers over the entire surface of the substrate during each of the manufacturing steps producing these three layers. When the three layers have been deposited, the superfluous parts of the layers, i.e. the parts between the screening member and the two opto-components, can be removed by etching, for instance.

Figure 5:
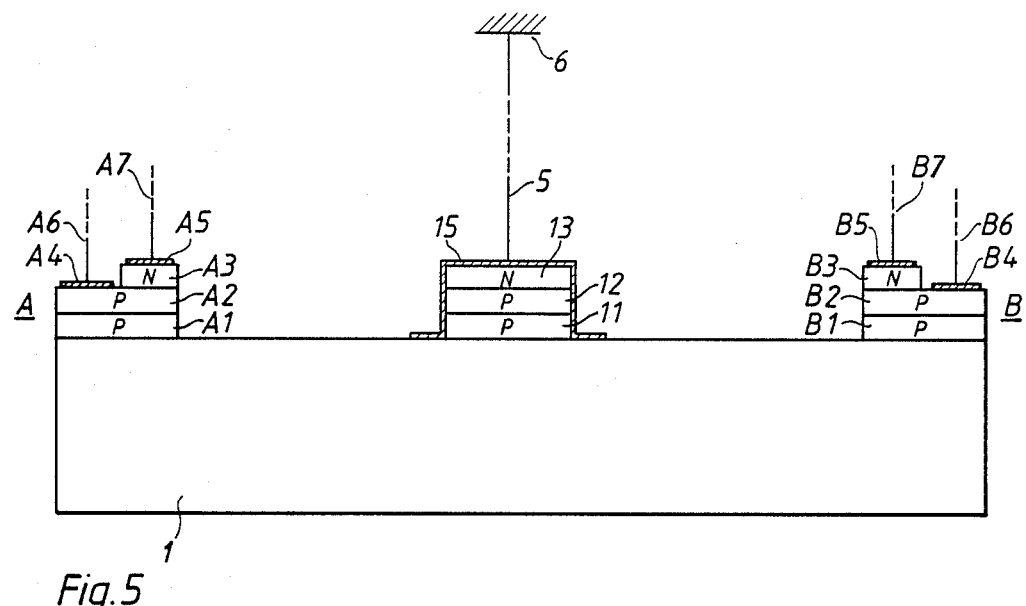

In the embodiment shown in FIG. 4, earthing is achieved by arranging a metal layer 15 on the layer 13, this layer 15 being connected to an earth point 6 via an earth conductor 5. Layer 12 or layer 11 may of course be earthed either alternatively or supplementarily. FIG. 5 shows a third alternative in which the metal layer 15 is deposited so that it covers the entire screening semiconductor body 11-12-13 and possibly also adjacent parts of the surface of the substrate 1.

Figure 6:
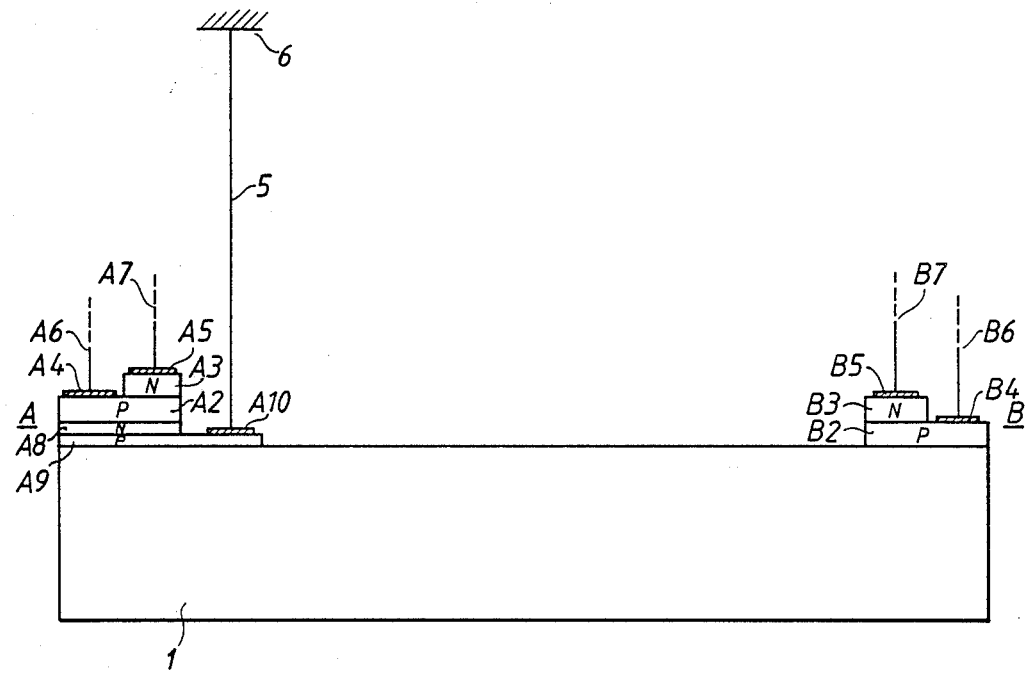

FIG. 6 shows another alternative embodiment of an optocoupler according to the invention. For the sake of simplicity, component A is shown as the light-emitting diode or photodiode formed by the layers A2 and A3. Obviously, the component may consist of additional layers in the known manner, such as an additional p-layer of the type shown in FIGS. 1-5. An n-conducting layer A8 and a p-conducting layer A9 are arranged between the component and the substrate 1. This is made in such a manner that two opposing pn-junctions, connected in series, are formed between the active part of the component—the pn-junction between layers A2 and A3—and the substrate. The layers A8 and A9 may suitably consist of material of the same type as that used in the opto-components and be produced using the same type of manufacturing steps as those used for the opto-components.

As previously mentioned, electrical interference can be transmitted resistively by a current flowing through the substrate between the two components. In the optocoupler according to FIG. 6, the pn-junctions formed by layers A2-A8-A9 will be situated in this current path and between the two components. Regardless of the polarity of any interference voltage appearing, one of these pn-junctions will always be biased in the reverse direction and will thus block resistive transmission of the interference (apart from leakage current through the blocking junction).

The screening means according to FIG. 6 is earthed by the layer A9 being connected to an earth point 6 by means of a metal layer A10 and an earth conductor 5. This ensures effective reduction of both capacitively and resistively transmitted interference. The layer A9, and suitably also the metal contact A10, may be extended towards the component B.

In the embodiment shown in FIG. 6, a reverse biased pn-junction will always exist between the component A and the substrate, regardless of the polarity of any interference or other voltages occurring. The component shown can be used for both one-way and two-way transmission and for optional potentials and levels of the supply and signal voltages. Extra layers may possibly be arranged below component B in the same way as below component A, thus also separating component B from the substrate during operation with the aid of a reverse biased pn-junction.

One of the layers may be earthed in the same way as for component A. Each of the components is then, of course, earthed on its own side of the optocoupler.

I claim:

1. A monolithic optocoupler comprising:
   an insulating substrate;
   two opto-components produced in an integrated form on said insulating substrate and spaced apart from each other, at least one of said components being arranged to emit optical radiation towards the other, and at least one of said components being arranged to receive radiation emitted by the other; and
   an electrically conducting layer for diverting electrical interference signals, said layer being produced in an integrated form on the surface of said insulating substrate between the two components and provided with connection means for grounding of said layer.

2. A monolithic optocoupler as claimed in claim 1, wherein said electrically conducting layer is produced on at least one wall of a groove extending through said insulating substrate.

3. A monolithic optocoupler as claimed in claim 2, wherein said insulating substrate is arranged to conduct optical radiation between said opto-components, and wherein said electrically conducting layer is so constructed as to be at least partially permeable to the optical radiation.

4. A monolithic optocoupler as claimed in claim 1, wherein said electrically conducting layer is made of metal.

5. A monolithic optocoupler as claimed in claim 1, wherein said electrically conducting layer consists of the same material as the material of the two opto-components.

6. A monolithic optocoupler as claimed in claim 1, comprising at least two layers of semi-conducting material arranged between an opto-component and said substrate, said layers being of opposite conductivity types and so arranged that when the optocoupler is in operation, a reverse biased pn-junction is formed between the layers.

7. A monolithic optocoupler as claimed in claim 6, wherein three layers of alternately opposite conducting types are arranged between the active junction of said opto-component and said substrate.

8. A monolithic optocoupler as claimed in claim 7, wherein one of said three layers, which is arranged nearest said substrate, is provided with connection means for grounding of said layer.

9. A monolithic optocoupler as claimed in claim 2, wherein said conducting layer is made of metal.

10. A monolithic optocoupler as claimed in claim 3, wherein said conducting layer is made of metal.

11. A monolithic optocoupler as claimed in claim 2, comprising two layers of semi-conducting material arranged between an opto-component and the substrate, said layers being of opposite conductivity types an d so arranged that when the optocoupler is in operation, a reverse biased pn-junction is formed between the layers.

12. A monolithic optocoupler as claimed in claim 3, comprising two layers of semi-conducting material arranged between an opto-component and the substrate, said layers being of opposite conductivity types and so arranged that when the optocoupler is in operation, a reverse biased pn-junction is formed between the layers.

13. A monolithic optocoupler as claimed in claim 4, comprising two layers of semi-conducting material arranged between an opto-component and the substrate, said layers being of opposite conductivity types and so arranged that when the optocoupler is in operation, a reverse biased pn-junction is formed between the layers.

14. A monolithic optocoupler as claimed in claim 5, comprising two layers of semi-conducting material arranged between an opto-component and the substrate, said layers being of opposite conductivity types and so arranged that when the optocoupler is in operation, a reverse biased pn-junction is formed between the layers.

15. A method of producing a monolithic optocoupler, comprising the steps of:
   providing an insulating substrate;
   producing two integrated opto-components on said substrate, spaced apart from each other, at least one of said components being arranged to emit optical radiation towards the other, and at least one of said components being arranged to receive radiation emitted by the other; and
   producing, in an integrated form, an electrically conducting layer for diverting electrical interference signals on the surface of said insulating substrate between the two components simultaneously with producing said opto-components, by the same integrated technique and from the same material as said opto-components; and
   providing connection means for grounding of said layer.

16. A monolithic optocoupler as claimed in claim 15, wherein said electrically conducting layer comprises a layer of semiconducting material on the surface of said substrate, said material being of the same type as the material of the two opto-components, and on the top of said layer of semiconducting material a metal layer is provided with connection means for grounding of said metal layer.

* * * * *